(12) United States Patent
Takiar et al.

(10) Patent No.: US 7,791,191 B2
(45) Date of Patent: Sep. 7, 2010

(54) SEMICONDUCTOR DEVICE HAVING MULTIPLE DIE REDISTRIBUTION LAYER

(75) Inventors: Hem Takiar, Fremont, CA (US); Shrikar Bhagath, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/617,687

(22) Filed: Dec. 28, 2006

(65) Prior Publication Data

US 2008/0157355 A1 Jul. 3, 2008

(51) Int. Cl.
*H01L 23/48* (2006.01)
(52) U.S. Cl. ............... 257/723; 257/786; 257/E21.001
(58) Field of Classification Search ................ 257/723, 257/734, 786, 737, E21.001, E21.01
See application file for complete search history.

(56) References Cited

U.S. PATENT DOCUMENTS

| | | | |
|---|---|---|---|
| 5,789,816 A | 8/1998 | Wu | |
| 5,976,911 A | 11/1999 | Bruce et al. | |
| 6,483,189 B1 * | 11/2002 | Fukunaga | 257/730 |
| 7,326,594 B2 * | 2/2008 | Beauchamp et al. | 438/123 |
| 2003/0122244 A1 | 7/2003 | Lin et al. | |
| 2004/0017003 A1 | 1/2004 | Saeki | |
| 2008/0157341 A1 | 7/2008 | Yang et al. | |

OTHER PUBLICATIONS

Notice of Allowance and Fee(s) Due dated Mar. 9, 2009 in U.S. Appl. No. 11/617,689.
International Preliminary Report on Patentability and Written Opinion of the International Searching Authority dated Jun. 30, 2009 in PCT Application No. PCT/US2007/088782.
International Search Report and Written Opinion dated Jul. 18, 2008 in PCT Application No. PCT/US2007/088782.
U.S. Appl. No. 11/617,689, filed Dec. 28, 2006.

* cited by examiner

*Primary Examiner*—Roy K Potter
(74) *Attorney, Agent, or Firm*—Vierra Magen Marcus & DeNiro LLP

(57) ABSTRACT

A semiconductor device and methods of forming same are disclosed having multiple die redistribution layer. After fabrication of semiconductor die on a wafer and prior to singulation from the wafer, adjacent semiconductor die are paired together and a redistribution layer may be formed across the die pair. The redistribution layer may be used to redistribute at least a portion of the bond pads from the first die in the pair to a second die in the pair. One die in each pair will be a working die and the other die in each pair will be a dummy die. The function of the integrated circuit beneath the redistribution layer on the dummy die is at least partially sacrificed.

20 Claims, 10 Drawing Sheets

SEMICONDUCTOR DEVICE HAVING MULTIPLE DIE REDISTRIBUTION LAYER

CROSS-REFERENCE TO RELATED APPLICATIONS

The following application is related to U.S. patent application Ser. No. 11/617,689, entitled "Method of Making a Semiconductor Device Having Multiple Die Redistribution Layer," by Hem Takiar and Shrikar Bhagath, filed the same day as the present application, which application is incorporated herein by reference in its entirety.

BACKGROUND OF THE INVENTION

1. Field of the Invention

Embodiments of the present invention relate to a multiple die redistribution layer for a semiconductor device and methods of forming same.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated as system-in-a-package (SiP) or multichip modules (MCM), where a plurality of die are mounted on a substrate. The substrate may in general include a rigid, dielectric base having a conductive layer etched on one or both sides. Electrical connections are formed between the die and the conductive layer(s), and the conductive layer(s) provide an electric lead structure for connection of the die to a host device. Once electrical connections between the die and substrate are made, the assembly is then typically encased in a molding compound to provide a protective package.

A top view of a conventional semiconductor package 20 (without molding compound) is shown in FIG. 1. Typical packages include a plurality of semiconductor die, such as die 22 and 24, affixed to a substrate 26. A plurality of die bond pads 28 may be formed on the semiconductor die 22, 24 during the die fabrication process. Similarly, a plurality of contact pads 30 may be formed on the substrate. Die 22 may be affixed to the substrate 26, and then die 24 may be mounted on die 22. Both die are then electrically coupled to the substrate by affixing wire bonds 32 between respective die bond pad 28 and contact pad 30 pairs.

Space within the semiconductor package is at a premium. Semiconductor die are often formed with bond pads along two adjacent sides, such as shown on die 24 in FIG. 1. However, owing to the significant real estate limitations, there may only be room on the substrate for a wire bond connection along one edge of the die. Thus, in FIG. 1, there are no contact pads along edge 34 of substrate 26 for connecting with die bond pads 28a.

One known method of handling this situation is through the use of a redistribution layer formed on a semiconductor die. After a semiconductor die is fabricated and singulated from the wafer, the die may undergo a process where electrically conductive traces and bond pads (traces 38 and bond pads 40, FIG. 1) are formed on the top surface of the die. Once formed, the traces 38 and bond pads 28a may be covered with an insulator, leaving only the newly formed die bond pads 40 exposed. The traces 38 connect the existing die bond pads 28a with the newly formed die bond pads 40 to effectively relocate the die bond pads to an edge of the die having a pin-out connection to the substrate. Additional contact pads 30 may be formed on the substrate to allow electrical connection between the substrate and the bond pads 28a. The additional contact pads 30 may be formed in-line with the remaining contact pads 30 as shown in prior art FIG. 1. Alternatively, where there is available space, the additional contact pads may be staggered with the remaining contact pads as shown in prior art FIG. 2.

As innovations in semiconductor fabrication have increased the signal capabilities of semiconductor die, the ability to transfer those signals to the substrate has become a limiting factor. Often, there simply is not enough room on a substrate for contact pads to support all of the pin-out connections from a semiconductor die. Finding space for substrate contact pads becomes an even bigger problem when die bond pads from one side of a die are relocated with a redistribution layer to another side already having bond pads. Referring to prior art FIG. 3, it is therefore further known to provide a dummy "jumper" die 50 along side a first die, such as die 24. Die 50 may simply be a block of silicon or other material without internal circuitry but having bond pads 52 on its surface. As shown in FIG. 3, wire bonds 32 may connect die bond pads 28a on the first die with the die bond pads 52 on the dummy die, and wire bonds 32 may then connect die bond pads 52 with the contact pads 30 on the substrate. The bond pads 52 on jumper die 50 are used to effectively relocate bond pads 28a on the first die 24 to a location along the edge of the substrate having room for a contact pad.

Prior art FIG. 4 is an edge view of the jumper die arrangement shown in FIG. 3 encapsulated in a molding compound 56 to form a finished semiconductor package 60. As shown, the wire bonds 32 coupling die 24 and 50 extend above the surfaces of die 24 and 50. While low profile wire bonding is known, such as for example reverse bonding, such low profile wire bonding techniques are not available in the context of the wire bond between die 24 and 50. While it is known to redistribute the die bond pads 28a from the first side of die 24 to the side of die 24 adjacent die 50 using a redistribution layer, a jumper bond wire is still required to electrically couple die 24 and 50.

As with space considerations on the substrate, there is also a push to decrease the thicknesses of semiconductor packages. While semiconductor die may at present be made quite thin (less than a mil), the height of the wire bond required in the above-described jumper die arrangement makes such an arrangement impractical for low thickness packages. There is therefore a need for a low thickness solution having adequate pin-out positions along a side of a substrate.

SUMMARY OF THE INVENTION

An embodiment of the present invention relates to a multiple die redistribution layer for a semiconductor device and methods of forming same. In an embodiment, after fabrication of semiconductor die on a wafer and prior to singulation from the wafer, adjacent semiconductor die are paired together and a redistribution layer may be formed across the die pair. The redistribution layer may be used to redistribute at least a portion of the bond pads from the first die in the pair to a second die in the pair. One die in each pair will be a working die and the other die in each pair will be a dummy die. The function of the integrated circuit beneath the redistribution layer on the dummy die is at least partially sacrificed.

The redistribution layer may be formed on the die pair by layering and etching successive dielectric and metal layers in a photolithographic process. Upon completion, one or more die bond pads on the working die may be redistributed to positions on the dummy die having a pin-out position for bonding to a substrate. For example, where a semiconductor die includes pads along two edges, but there is only room on the substrate for pin-out connections along one of the edges, the bond pads along the remaining edge may be relocated to the dummy die where they may then be wire bonded to the substrate. It is understood that die bond pads from any location on the first semiconductor die of the pair may be redistributed to any location on the second semiconductor die of the pair by a redistribution layer formed across the die at the wafer level.

After the redistribution layer is formed, the semiconductor wafer may be singulated from the wafer, with each die pair singulated as a single component. The die pair may be mounted on a substrate, together with one or more other semiconductor die. Thereafter, the die bond pads of die pair may be wire bonded to the substrate and the semiconductor die and substrate encapsulated to form a semiconductor package. In embodiments, the package may function as a flash memory device, where the working die is a controller such as an ASIC. Other semiconductor devices are contemplated.

DETAILED DESCRIPTION

Embodiments of the present invention will now be described with reference to FIGS. 5 through 25, which relate to a multiple die redistribution layer for a semiconductor device and methods of forming same. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 1:
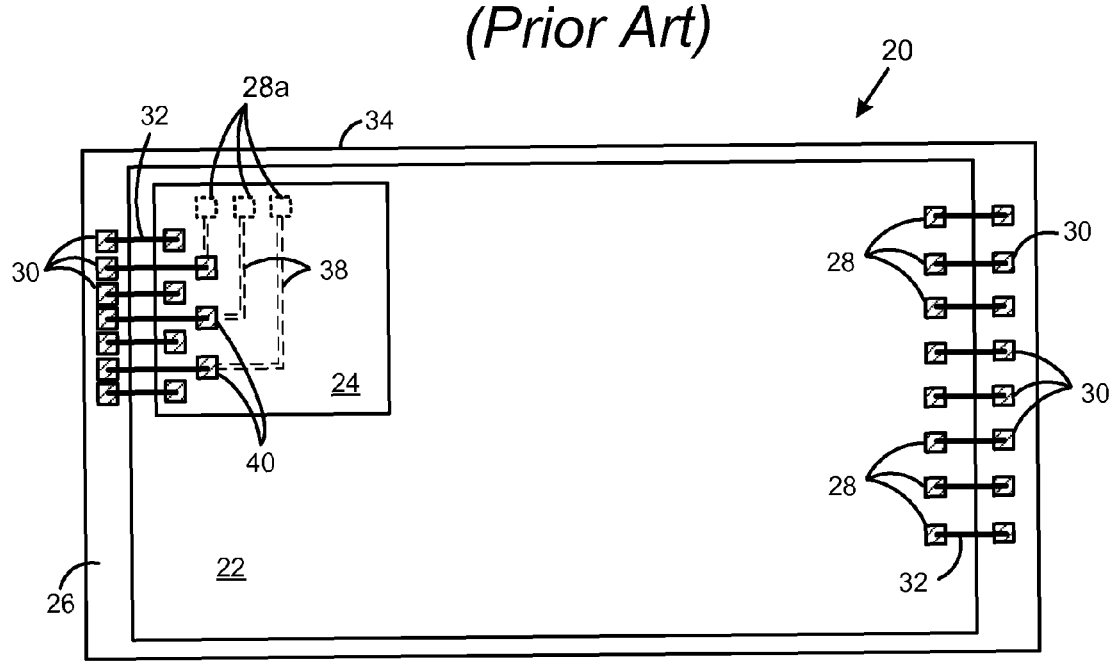
FIG. 1 is a top view of a conventional semiconductor package including a semiconductor die having a redistribution layer to redistribute die bond pads from a first edge to a second edge of the die.
Figure 2:
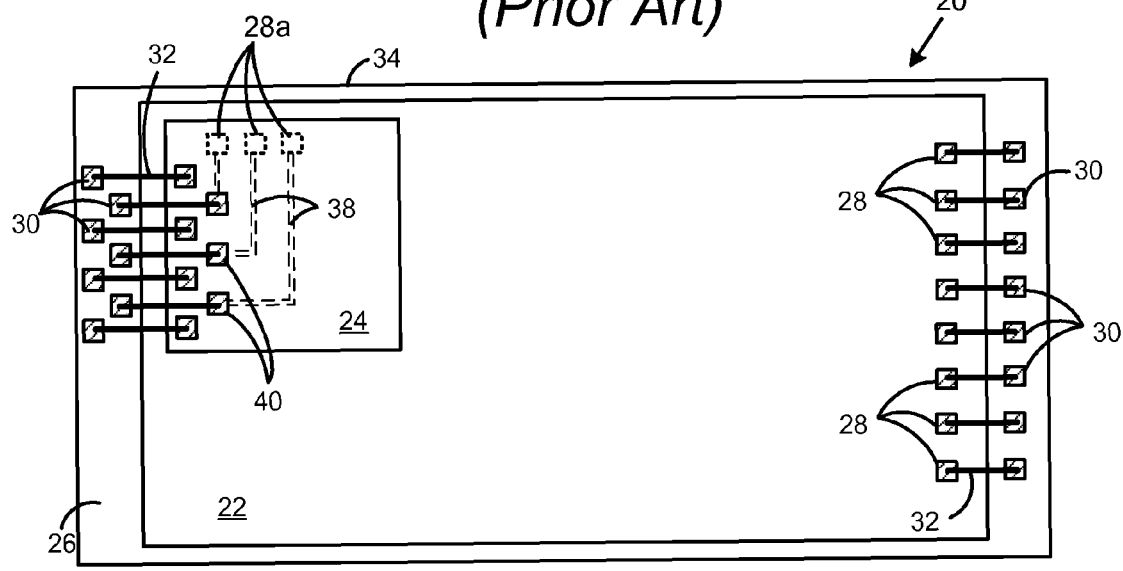
FIG. 2 is a top view of a conventional semiconductor package including a die having a redistribution layer as in FIG. 1 with an alternative substrate contact pad arrangement.
Figure 3:
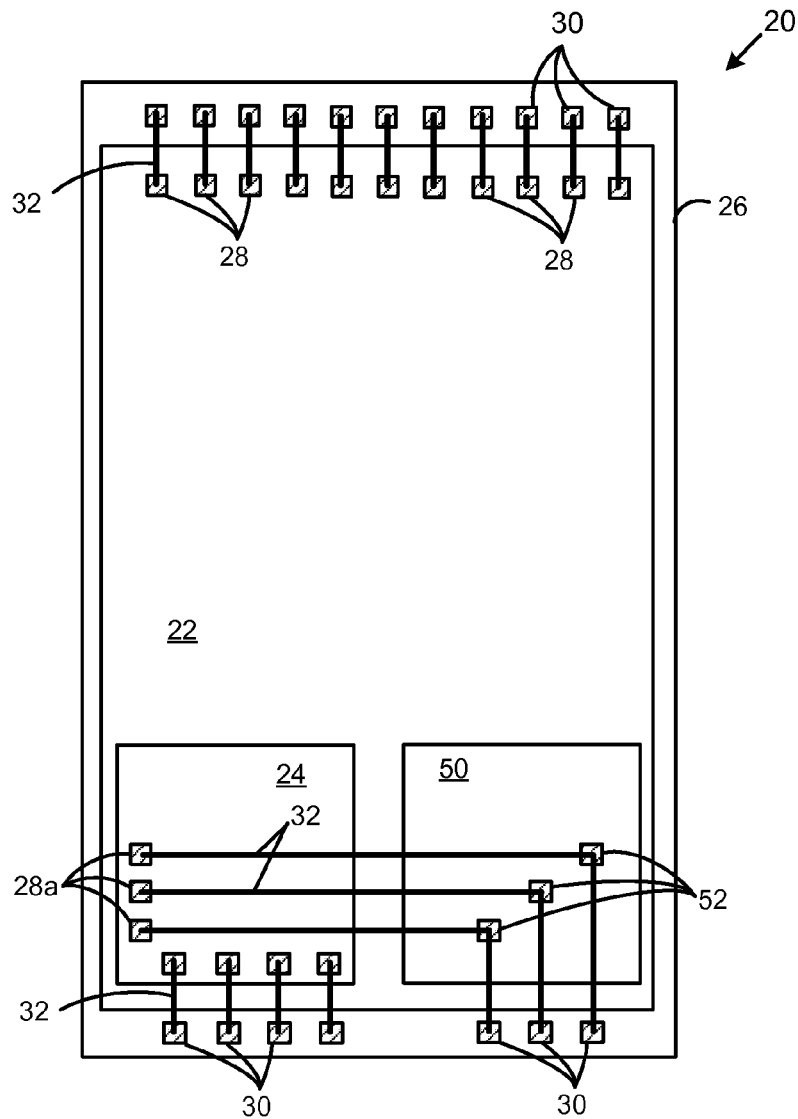
FIG. 3 is a top view of a conventional semiconductor package including a jumper die and jumper bond wires for redistributing the bond pads of a working die.
Figure 4:
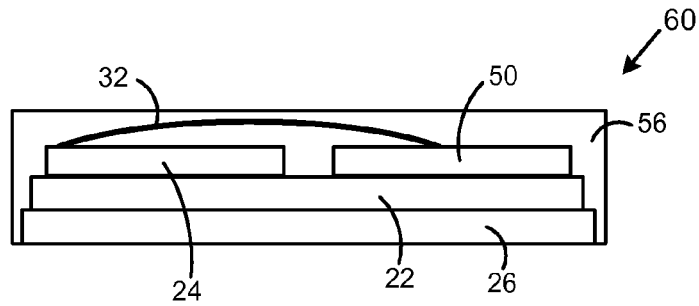
FIG. 4 is an edge view of a conventional semiconductor package shown in prior art FIG. 3.
Figure 5:
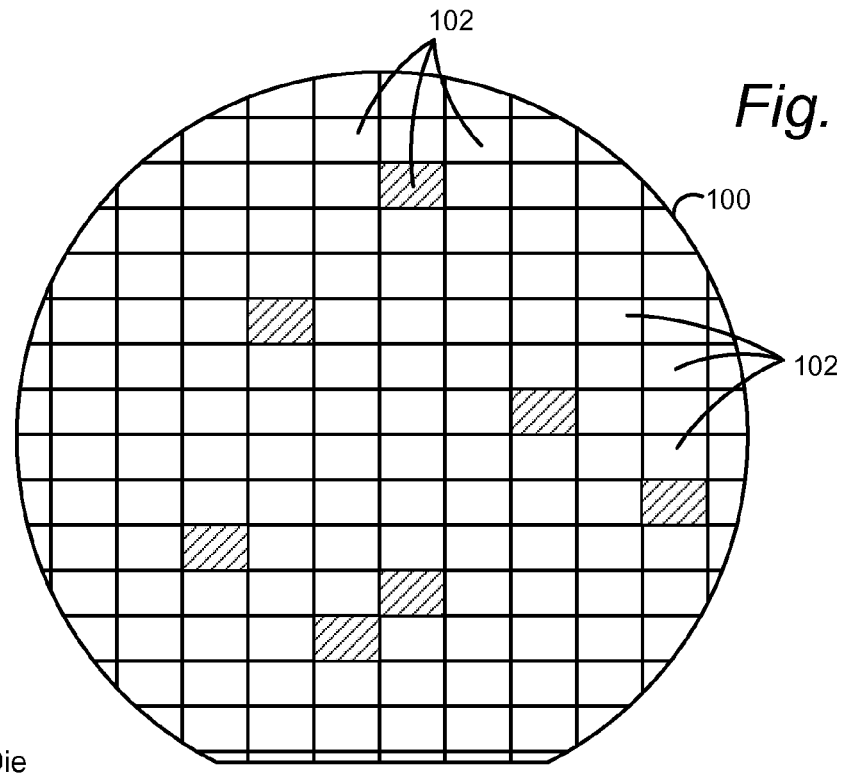
FIGS. 5 and 6 are top views of a semiconductor wafer for use in accordance with the present invention.

Referring now to FIG. 5, there is shown a top view of a semiconductor wafer 100 including a plurality of semiconductor die 102. Each semiconductor die 102 on wafer 100 has been processed to include an integrated circuit as is known in the art capable of performing a specified electronic function. All of semiconductor die 102 on wafer 100 may have the same integrated circuit, though it is contemplated that different die may have different integrated circuits in alternative embodiments. As is known in the art, the respective integrated circuits may be tested during wafer fabrication to identify defective or bad die, indicated in FIG. 5 with shading.

Figure 6:
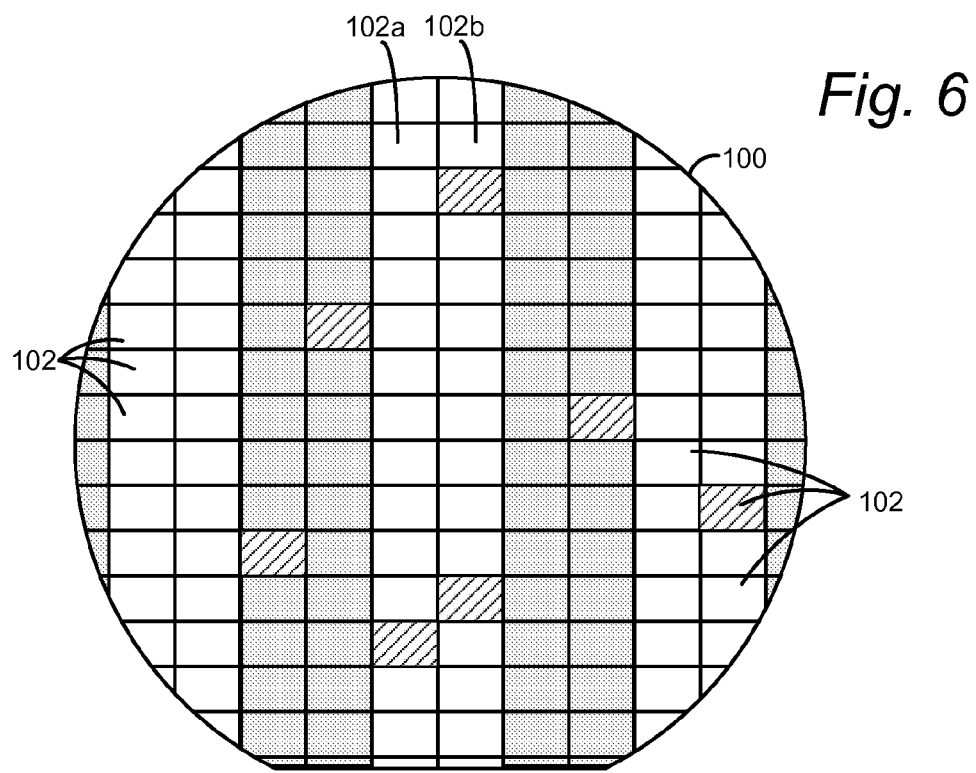

Upon completion of wafer fabrication testing, normally each of the die 102 would be singulated into individual die and thereafter assembled into a semiconductor package. However, according to an embodiment of the present invention, adjacent die 102 on wafer 100 are paired off, and a redistribution layer is formed across the surface of the die pairs as explained below. As shown in FIG. 6, adjacent die in a row may be paired to form columns of paired die on the wafer (as indicated by the alternate shading of columns in FIG. 6). Although embodiments of the present invention described hereinafter include die pairs, it is understood that more than two die may be grouped together, and thereafter a single redistribution layer may be formed across all die in the respective groups. In such an embodiment, the number of rows and/or columns in a group may vary.

In embodiments where semiconductor die 102 are grouped in pairs, one die in each pair will be the working die 102a and the other die in each pair will be a dummy die 102b. As explained hereinafter, when the redistribution layer is formed on the dummy die, the function of the integrated circuit beneath the redistribution layer on the dummy die is at least partially sacrificed.

In embodiments, the decision of how to layout the redistribution layer on the wafer may be based in part on the number and location of the bad die to maximize the number of bad die used as dummy die. For example, in the embodiment in FIG. 6, in each die pair, the left die may be the working die and the right die may be the dummy die (it may be otherwise in alternative embodiments). By selecting to position the columns for the working and dummy die as shown in FIG. 6, five of the seven bad die will be used as dummy die, and only two bad die are positioned as working die. The decision of how to layout the columns of paired die may be made independent of the location of bad die in embodiments of the present invention.

Figure 8:
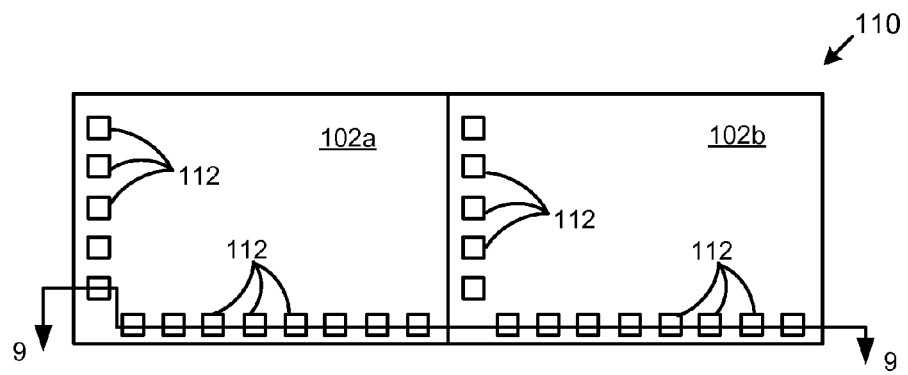
FIG. 8 is a top view of a semiconductor die pair from the wafer shown in FIGS. 5 and 6.
Figure 9:
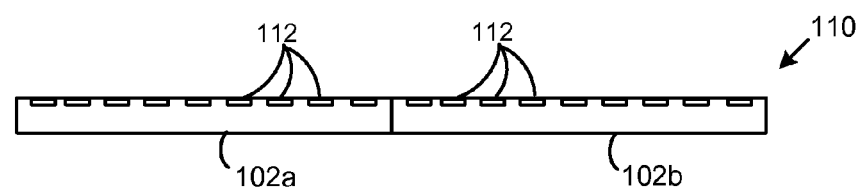
FIG. 9 is a cross-sectional view through line 9-9 in FIG. 8.

The process for forming a redistribution layer on each die pair and a semiconductor device formed therefrom is explained hereinafter with respect to the flowchart of FIG. 7 and the respective top and edge views of FIGS. 8-21. The following description applies to all paired die on wafer 100. The top and edge views of FIGS. 8 and 9 show a die pair 110 from wafer 100 including a pair of semiconductor die 102a and 102b. Each semiconductor die 102a, 102b may include a plurality of die bond pads 112 exposed on a surface of the die for electrically coupling the die to a substrate or other component. The die bond pads 112 formed on the surface of the semiconductor die prior to application of the redistribution layer explained hereinafter may be referred to as inner bond pads. In the embodiment shown, each semiconductor die 102a, 102b includes inner bond pads along two adjacent edges. It is understood that each semiconductor die 102a, 102b may be formed with die bond pads 112 along a single edge, along two opposed edges, along three edges or around all four edges in alternative embodiments.

Figure 7:
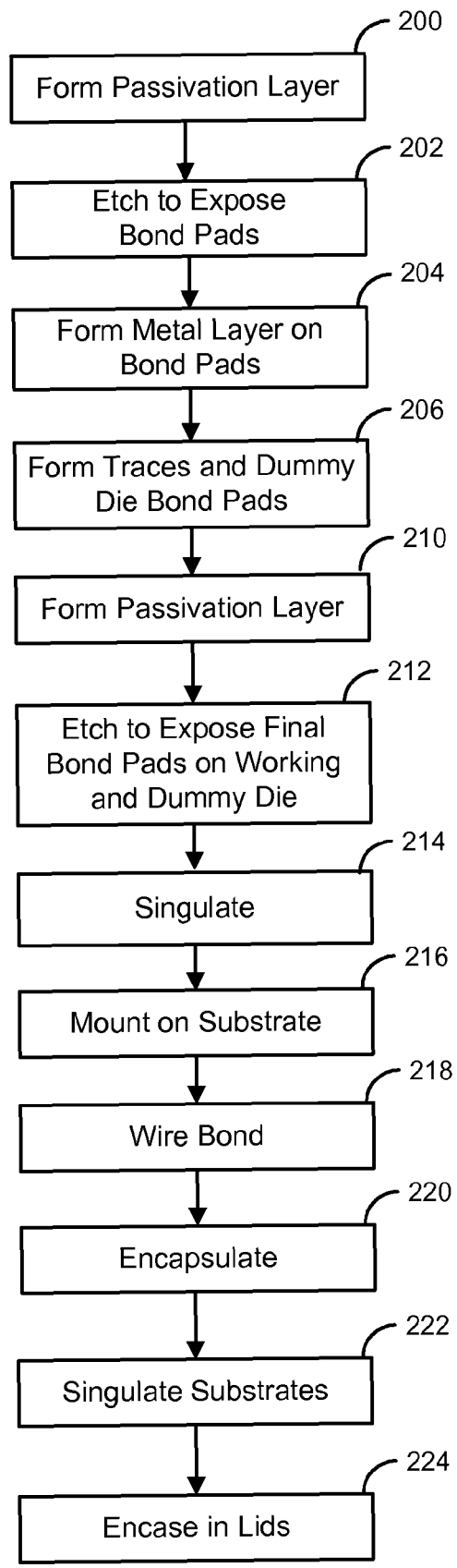
FIG. 7 is a flowchart for the fabrication steps of a redistribution layer and semiconductor device formed thereby according to an embodiment of the present invention.
Figure 10:
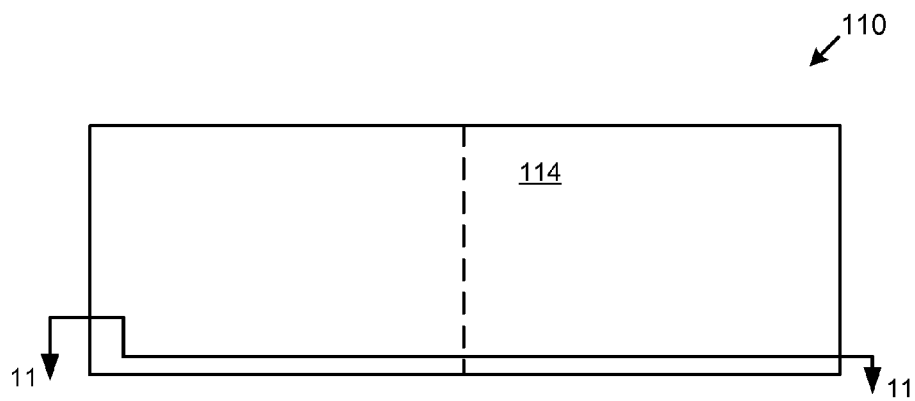
FIG. 10 is a top view of the semiconductor die pair after a first step in forming the redistribution layer according to an embodiment of the present invention.
Figure 11:
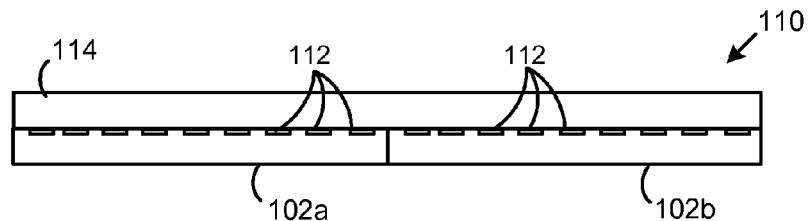
FIG. 11 is a cross-sectional view through line 11-11 in FIG. 10.

Referring now to the flowchart of FIG. 7 and the top and edge views of FIGS. 10 and 11, a passivation layer 114 may be applied to the semiconductor die pair 110 to cover all bond pads 112 on die 102a, 102b in a step 200. Passivation layer 114 may be any number of dielectric materials, such as for example photo-definable benzocyclobutane or other known suitable materials, applied in a known process.

Figure 12:
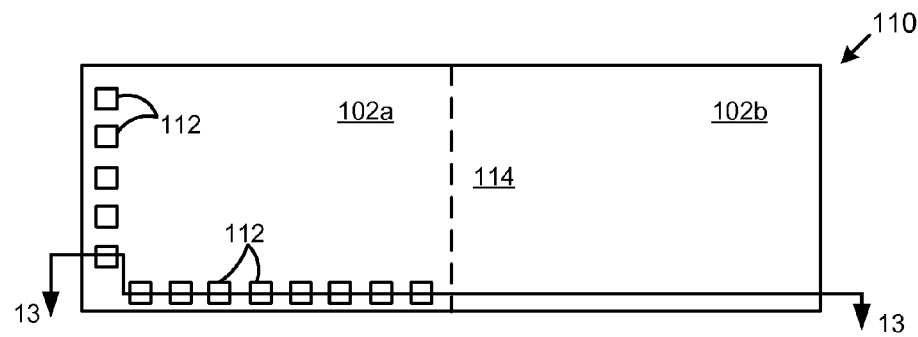
FIG. 12 is a top view of the semiconductor die pair after a second step in forming the redistribution layer according to an embodiment of the present invention.
Figure 13:
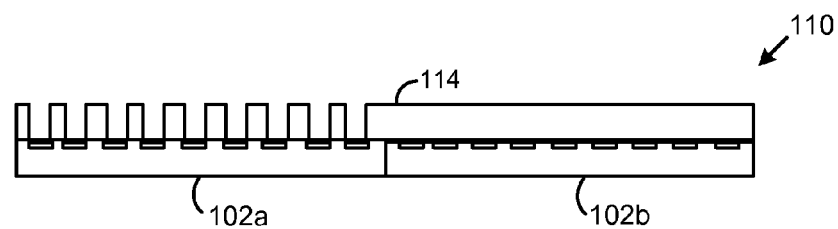
FIG. 13 is a cross-sectional view through line 13-13 in FIG. 12.

Referring now to the top and edge views of FIGS. 12 and 13, in a step 202, passivation layer 114 may be etched to expose all die bond pads 112 on semiconductor die 102a. The die bond pads 112 on semiconductor die 102b remain covered by passivation layer 114. Passivation layer 114 may be etched using known photolithography and etching techniques to expose die bond pads 112 on semiconductor die 102a.

Figure 14:
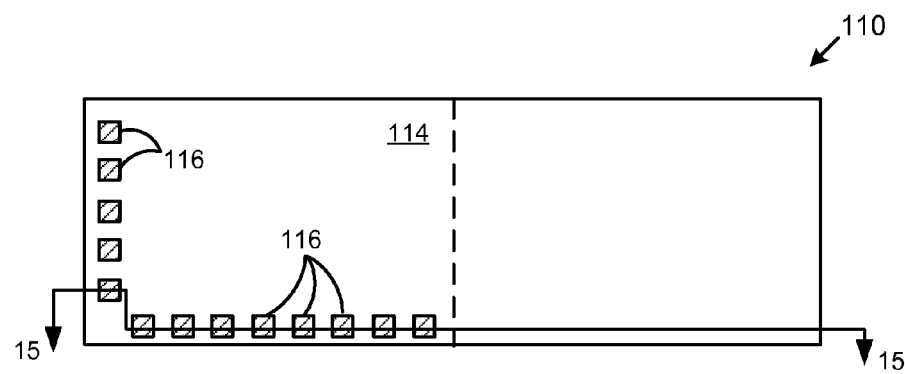
FIG. 14 is a top view of the semiconductor die pair after a first step in forming the redistribution layer according to an embodiment of the present invention.
Figure 15:
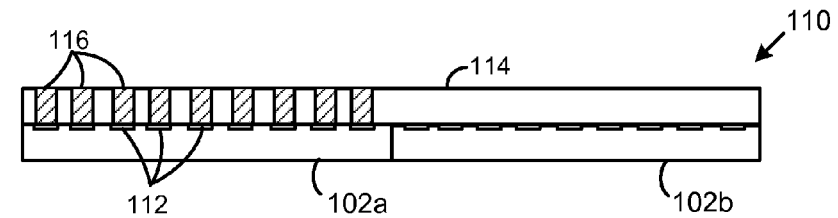
FIG. 15 is a cross-sectional view through line 15-15 in FIG. 14.

Referring now to FIGS. 14 and 15, in step 204, an electrical conductor may be deposited on the die bond pads 112 exposed in the etching process of step 202. The electrical conductor may for example be gold, aluminum, copper, nickel or alloys thereof. In embodiments using for example gold, a barrier metal may be deposed between the bond pads and the gold layer to enhance bonding and conductive properties. The electrical conductor 116 may be applied on bond pads 112 by known deposition processes, such as for example sputtering. Once the metal conductor has been applied, the upper surface of the semiconductor die pair 110 may be polished to provide an even, flat surface.

Figure 16:
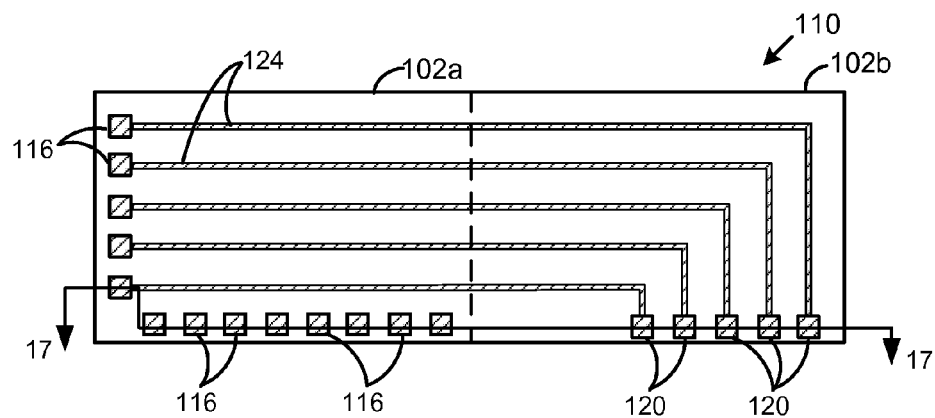
FIG. 16 is a top view of the semiconductor die pair after a first step in forming the redistribution layer according to an embodiment of the present invention.
Figure 17:
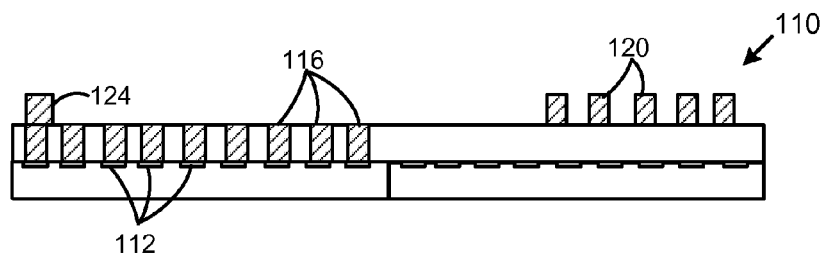
FIG. 17 is a cross-sectional view through line 17-17 in FIG. 16.

Referring now to FIGS. 16 and 17, in step 206, a layer of metal may be applied on the top surface of semiconductor die pair 110 and then photolithographically processed to define a plurality of die bond pads 120 on semiconductor die 102b and a plurality of electrical traces 124. The electrical traces 124 extend between and electrically couple certain of the die bond pads 112 on die 102a (via connection with the electrical conductor 116 on pads 112) with the newly formed die bond pads 120 on die 102b. In particular, the die bond pads 112 on die 102a coupled to traces 124 are those die bond pads which are to be redistributed from the working die 102a to the bond pads 120 on dummy die 102b. In the embodiment shown, all of the die bond pads 112 along the left edge of semiconductor die 102a are relocated to the bottom edge of semiconductor die 102b. As will be explained hereinafter, die bond pads at other locations on semiconductor die 102a may be redistributed to other locations on semiconductor die 102b.

Figure 18:
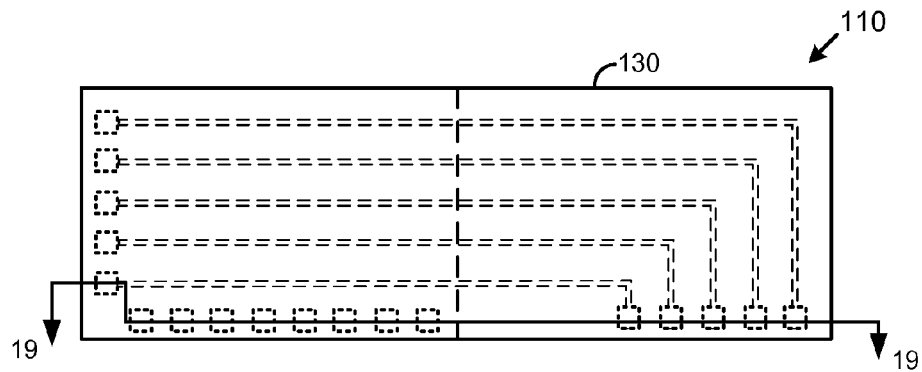
FIG. 18 is a top view of the semiconductor die pair after a first step in forming the redistribution layer according to an embodiment of the present invention.
Figure 19:
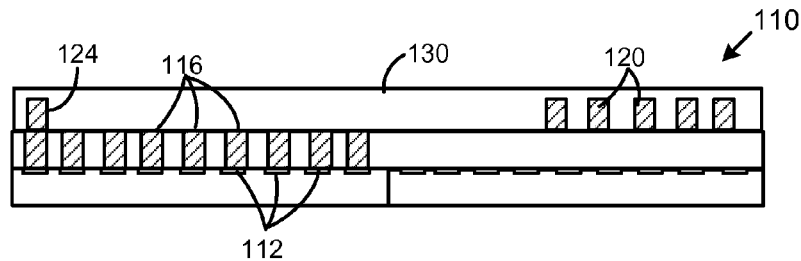
FIG. 19 is a cross-sectional view through line 19-19 in FIG. 18.

Referring now to FIGS. 18 and 19, in step 210, a second passivation layer 130 may next be applied to the top surface of semiconductor die pair 110 to cover all electrical conductors 116, die bond pads 120 and metal traces 124. Passivation layer 130 may be the same as passivation layer 114 described above.

Figure 20:
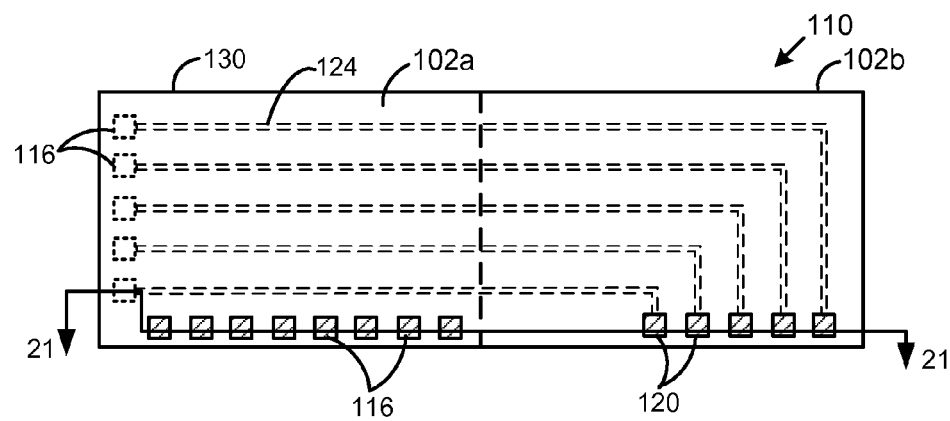
FIG. 20 is a top view of the semiconductor die pair after a first step in forming the redistribution layer according to an embodiment of the present invention.
Figure 21:
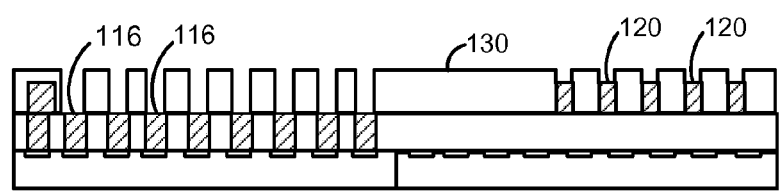
FIG. 21 is a cross-sectional view through line 21-21 in FIG. 20.

Referring now to FIGS. 20 and 21, in step 212, passivation layer 130 may be etched to expose the final locations of the die bond pads on the semiconductor die pair 110. For example, in the embodiment shown, the passivation layer 130 may be etched using known photolithography and etching techniques to expose electrical conductors 116 along the bottom edge of semiconductor die 102a and the die bond pads 120 on semiconductor die 102b. The electrical conductors 116 along the left edge of die 102a may remain embedded within and covered by passivation layer 130. The electrical conductors 116 and bond pads 120 which are exposed at the surface of the redistribution layer after the above-described steps may be referred to as the outer bond pads.

Steps 206 and 210 described above result in the electrical conductors 116 forming outer bond pads which are at a different elevation than outer bond pads 120. Referring back to FIGS. 16 and 17, the metal layer that was applied and patterned in step 206 to define traces 124 and die bond pads 120 may also be applied over the electrical conductors 116 along the bottom edge of die 102a. In such an embodiment, after application (step 210) and etching (step 212) of passivation layer 130, the final positions of the outer die bond pads on the die 102a and 102b may all be at the same elevation.

Figure 22:
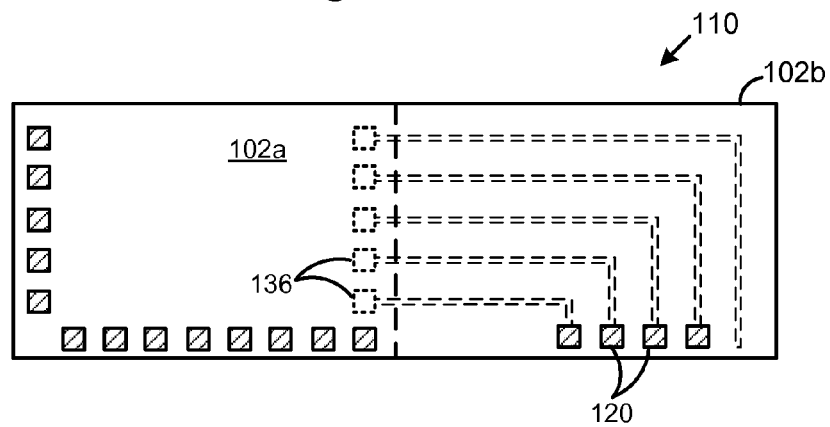
FIG. 22 is a top view of an alternative embodiment of a redistribution layer on a die pair according to the present invention.

The above-described steps are one of many possible processes for forming a redistribution layer on adjacent die pairs at the wafer level for redistributing the die bond pads from one die to the next. Moreover, FIGS. 8-21 show a particular embodiment where die bond pads along a first edge of die 102a are redistributed to a second edge of die 102b. It is understood that using the above-described or other redistribution layer process steps, die bond pads from any location on a first semiconductor die may be redistributed to any location on a second semiconductor die by a redistribution layer across the die formed at the wafer level. For example, FIG. 22 shows a top view of a semiconductor die 102a initially having die bond pads formed along three edges of the die. Using the above-described process steps, a column of die bond pads 136 on die 102a may be redistributed to bond pads 120 and die 102b. Other possible configurations are contemplated.

In the above-described steps, none of the inner bond pads 112 on dummy die 102b are used after formation of the redistribution layer. However, in alternative embodiments, not all of the bond pads 112 on dummy die 102b may go unused. Some of the inner bond pads on dummy die 102b may also be electrically coupled to outer bond pads on dummy die 102b (or redistributed to another die) where there is an available pin-out location to a substrate. In such an embodiment, the dummy die 102b may serve two functions. The die 102b may provide outer bond pads which serve as redistribution points for the inner bond pads on working die 102a. The die 102b may also operate at least in part as a working die where signals from the integrated circuit on the 102b are communicated to the substrate.

Figure 23:
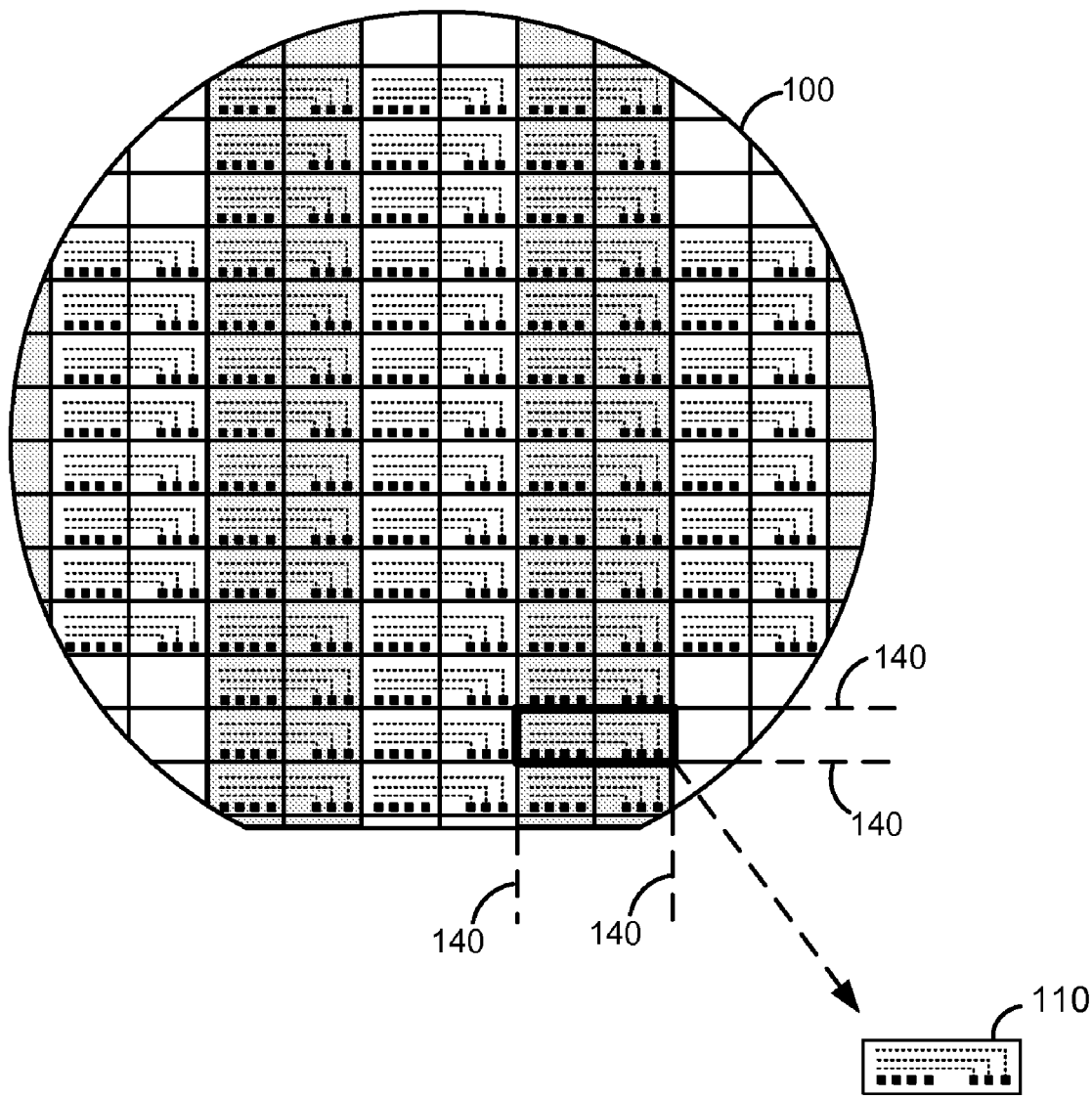
FIG. 23 is a top view of the semiconductor wafer including a redistribution layer formed thereon according to an embodiment of the present invention.

Referring now to FIG. 23, at the completion of the above-described steps, after formation of the redistribution layer on respective wafer pairs, the semiconductor wafer may be singulated from the wafer 100 in a step 214. As indicated by the dashed cutting lines 140, each die pair 110 may be singulated as a single component. As indicated above, a group of die on which a single redistribution layer is formed may be one row and two columns, but groups of die which are singulated together may include other numbers of rows and/or columns in alternative embodiments.

Figure 24:
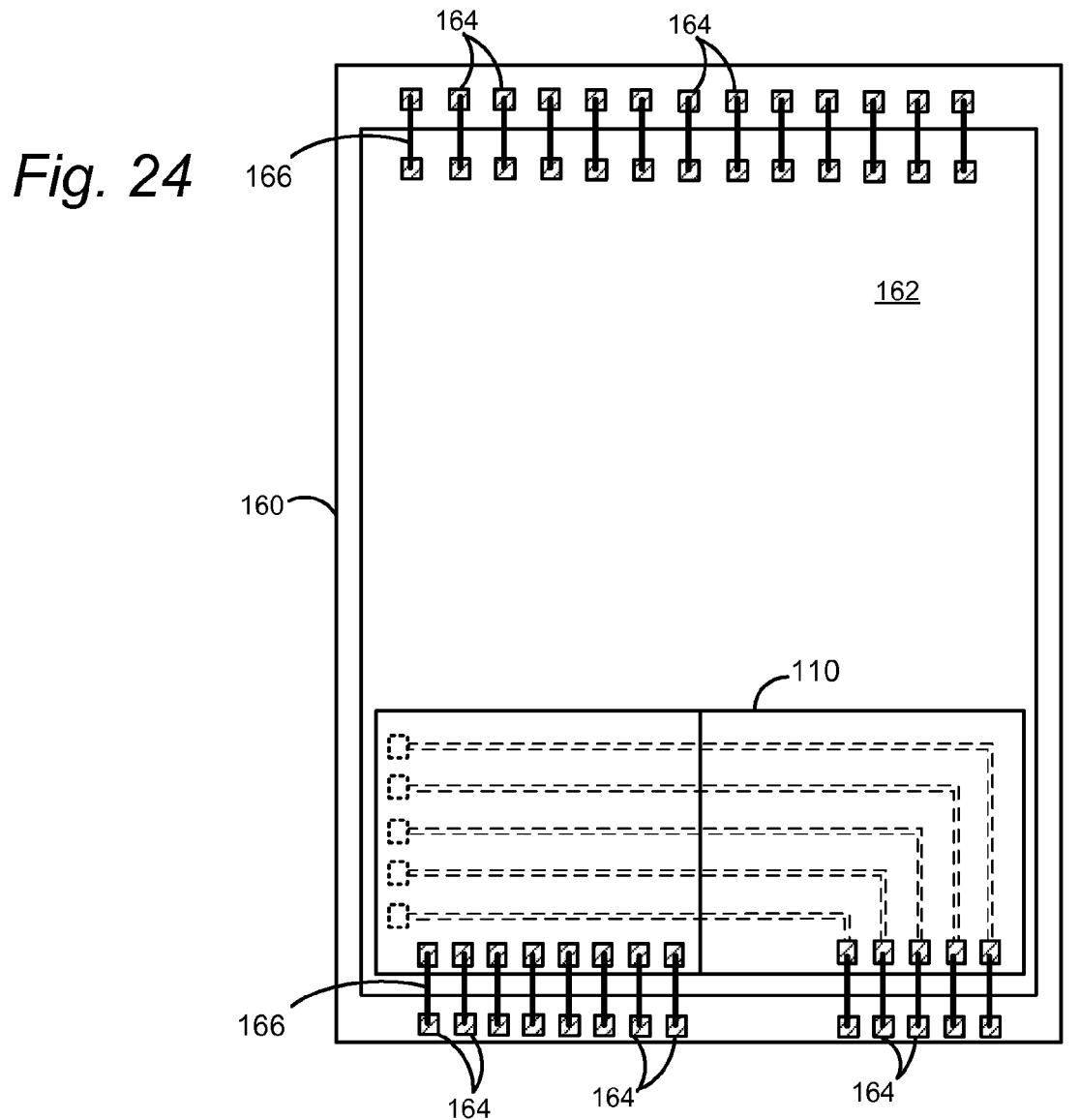
FIG. 24 is a top view of a semiconductor package including a die pair fabricated to include a redistribution layer.

Referring now to FIG. 24, in step 216, the die pair 110 may be mounted on a substrate 160 of a panel of substrates 160 batch processed together. The die pair 110 may be the only die mounted on a substrate 160, or the die pair 110 may be mounted to substrate 160 along with one or more additional die 162 as shown in FIG. 24. Thereafter, in step 218, the outer die bond pads on die pair 110 and any other die may be wire bonded to contact pads 164 on substrate 160 using wire bonds 166 in a known wire bond process. In embodiments, the die and substrate together may function as a flash memory device, where die 102a is a controller such as an ASIC, die 102b is a dummy die for redistributing bond pads from die 102a and die 162 is a flash memory die. The die pair 110 may be other than a controller and dummy die in alternative embodiments, and the die and substrate together may be other than a flash memory device in alternative embodiments.

As explained in the Background of the Invention, in some package configurations, there is room for pin-out locations only along a single edge of a semiconductor die. As seen in FIG. 24, the redistribution layer applied to semiconductor die pair 110 effectively redistributes the bond pads from die 102a to a position on die 102b where they can be easily bonded to substrate 160. The relative lengths and relative widths of the semiconductor die pair 110, semiconductor die 162 and substrate 160 shown in FIG. 24 is by way of example only and may vary widely in alternative embodiments of the present invention.

Figure 25:
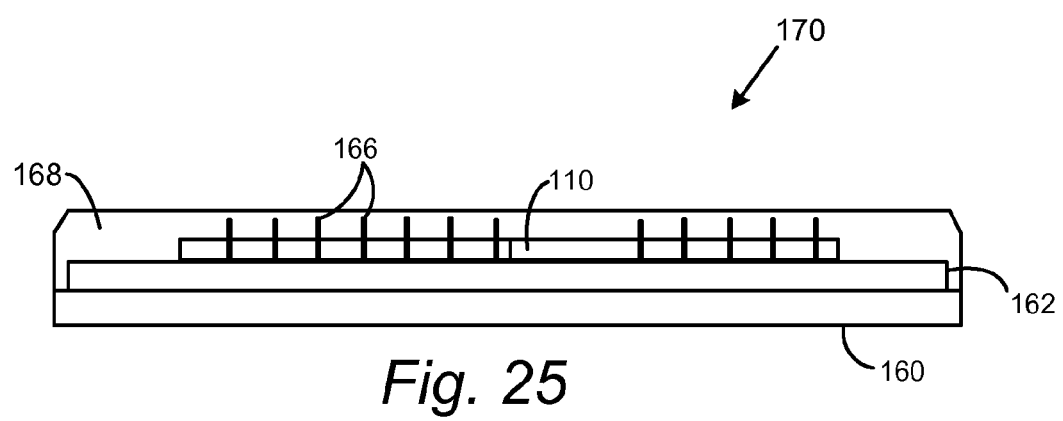
FIG. 25 is an edge view of a semiconductor package having a die pair with a redistribution layer encapsulated in molding compound according to an embodiment of the present invention.

As shown in FIG. 25, after forming the stacked die configuration according to any of the above described embodiments, the panel of substrates including the individual semiconductor packages may be encased within the molding compound 168 in step 220, and singulated from the panel in step 222, to form a finished semiconductor die package 170. Molding compound 168 may be a known epoxy such as for example available from Sumitomo Corp. and Nitto Denko Corp., both having headquarters in Japan. Thereafter, the finished package 170 may optionally be enclosed within a lid in step 224.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor device, comprising:
   a first semiconductor die having internal circuitry, a first set of inner bond pads electrically connected to the internal circuitry of the first semiconductor die, and a first edge;
   a second semiconductor die having internal circuitry, a second set of inner bond pads electrically connected to the internal circuitry of the second semiconductor die, and a second edge adjacent the first edge of the first semiconductor die; and
   a redistribution layer formed on surfaces of the first and second semiconductor die and including:
      a set of outer bond pads on at least the second semiconductor die for electrically connecting the first semiconductor die with an external device,
      an electrical connection between one of the inner bond pads of the first set of inner bond pads on the first semiconductor die and an outer bond pad of the set of outer bond pads on the second semiconductor die, and
      at least a majority of inner bond pads of the second set of inner bond pads on the second semiconductor having no electrical connection to an external device.

2. A semiconductor device as recited in claim 1, the set of outer bond pads on at least the second semiconductor die further comprising outer bond pads on the first semiconductor die.

3. A semiconductor device as recited in claim 1, the first and second semiconductor die being singulated as a single component from a semiconductor wafer.

4. A semiconductor device as recited in claim 1, wherein none of the inner bond pads of the second semiconductor die have an electrical connection to an external device.

5. A semiconductor device as recited in claim 1, wherein the set of outer bond pads of the redistribution layer are capable of connecting to the host device via electrical leads wire bonded to the set of outer bond pads.

6. A semiconductor device as recited in claim 5, wherein the electrical leads are low loop wire bonds.

7. A semiconductor device as recited in claim 1, wherein the set of outer bond pads of the redistribution layer are capable of connecting to the host device via solder balls soldered to the set of outer bond pads.

8. A semiconductor device as recited in claim 1, wherein the first semiconductor die is a microprocessor.

9. A semiconductor device as recited in claim 1, wherein the first semiconductor die is an application-specific integrated circuit.

10. A semiconductor device as recited in claim 1, wherein the first semiconductor die is a flash memory circuit.

11. A semiconductor device, comprising:
    first and second semiconductor die formed contiguously on a wafer and singulated as an integral component, the first semiconductor die including one or more inner bond pads; and
    a redistribution layer provided on the first and second semiconductor die and including one or more outer bond pads on the second semiconductor die, the redistribution layer electrically connecting the one or more inner bond pads on the first semiconductor die to the one or more outer bond pads on the second semiconductor die, wherein the one or more outer bond pads of the redistribution layer are capable of connecting to a host device via electrical leads wire bonded to the one or more outer bond pads.

12. A semiconductor device, comprising:

first and second semiconductor die formed contiguously on a wafer and singulated as an integral component, the first semiconductor die including one or more inner bond pads; and a redistribution layer provided on the first and second semiconductor die and including one or more outer bond pads on the second semiconductor die, the redistribution layer electrically connecting the one or more inner bond pads on the first semiconductor die to the one or more outer bond pads on the second semiconductor die, wherein the one or more outer bond pads of the redistribution layer are capable of connecting to a host device via solder balls soldered to the one or more outer bond pads.

13. A semiconductor device, comprising:

first and second semiconductor die formed contiguously on a wafer and singulated as an integral component, the first semiconductor die including one or more inner bond pads;

a redistribution layer provided on the first and second semiconductor die and including one or more outer bond pads on the second semiconductor die, the redistribution layer electrically connecting the one or more inner bond pads on the first semiconductor die to the one or more outer bond pads on the second semiconductor die; and a host device on which the first and second semiconductor die are mounted and electrical connections between one or more of the outer bond pads and contact pads on the host device.

14. A semiconductor device as recited in claim 13, wherein the host device comprises a printed circuit board.

15. A semiconductor device as recited in claim 13, wherein the host device comprises a lead frame.

16. A semiconductor device as recited in claim 13, further comprising molding compound for encapsulating at least the first and second semiconductor die.

17. A semiconductor device as recited in claim 13, the second semiconductor die including one or more inner bond pads covered by the redistribution layer.

18. A semiconductor device as recited in claim 13, the second semiconductor die including one or more inner bond pads exposed through a surface of the redistribution layer.

19. A semiconductor device as recited in claim 18, further comprising electrical connections between the host device and one or more inner bond pads of the second semiconductor die exposed through a surface of the redistribution layer.

20. A semiconductor wafer comprising:

a plurality of semiconductor die, first and second contiguous semiconductor die of the plurality of semiconductor die each including circuitry capable of performing an identical function and each including inner bond pads;

a redistribution layer provided on the first and second semiconductor die and including one or more outer bond pads on the second semiconductor die, the redistribution layer electrically connecting one or more inner bond pads on the first semiconductor die to the one or more outer bond pads on the second semiconductor die, wherein the one or more outer bond pads are configured to receive one of one or more wire bond loops, or one or more solder balls.

\* \* \* \* \*